(12) United States Patent
Kämpe

(10) Patent No.: US 10,666,193 B2
(45) Date of Patent: May 26, 2020

(54) BIASING CIRCUIT FOR CAPACITOR SWITCH TRANSISTOR AND METHOD THEREFORE

(71) Applicant: Telefonaktiebolaget LM Ericsson (publ), Stockholm (SE)

(72) Inventor: Andreas Kämpe, Lidingö (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/322,288

(22) PCT Filed: Aug. 23, 2016

(86) PCT No.: PCT/SE2016/050782
§ 371 (c)(1),
(2) Date: Jan. 31, 2019

(87) PCT Pub. No.: WO2018/038651
PCT Pub. Date: Mar. 1, 2018

(65) Prior Publication Data
US 2020/0052647 A1    Feb. 13, 2020

(51) Int. Cl.
*H03B 5/12* (2006.01)
*H03J 5/24* (2006.01)

(52) U.S. Cl.
CPC ......... *H03B 5/1265* (2013.01); *H03B 5/1253* (2013.01); *H03B 5/1296* (2013.01);
(Continued)

(58) Field of Classification Search
CPC .. H03B 5/1265; H03B 5/1228; H03B 5/1215; H03B 5/1296; H03B 5/1212;
(Continued)

(56) References Cited

U.S. PATENT DOCUMENTS

| 7,084,713 B2 * | 8/2006 | Peluso | H03B 5/1228 |
| | | | 331/179 |
| 7,154,349 B2 * | 12/2006 | Cabanillas | H03B 5/1218 |
| | | | 331/117 R |

(Continued)

FOREIGN PATENT DOCUMENTS

WO    2016054612 A1    4/2016

OTHER PUBLICATIONS

Yang, Dongxu, et al., "Design of a 24GHz Low Phase-Noise, Wide Tuning-Range VCO with Optimized Switched in Capacitor Array and Bias Filtering Technique," 10th IEEE International Conference on Solid-State and Integrated Circuit Technology, Shanghai, 2010, IEEE, pp. 696-698.

(Continued)

*Primary Examiner* — Ryan Johnson
(74) *Attorney, Agent, or Firm* — Withrow & Terranova, PLLC

(57) ABSTRACT

A biasing circuit for biasing a switching transistor, wherein the switching transistor is used for switching a respective capacitor cell into/out of a capacitor array, wherein the capacitor array comprises one or more such capacitor cells, and wherein the capacitor array is coupled in parallel with a primary inductor to form an inductive/capacitive tank. The biasing circuit comprises a secondary inductor which is inductively coupled to the primary inductor, the secondary inductor configured to provide a bias signal for biasing the switching transistor.

22 Claims, 15 Drawing Sheets

(52) U.S. Cl.
CPC ........ *H03J 5/246* (2013.01); *H03B 2200/005* (2013.01); *H03B 2200/0062* (2013.01); *H03B 2201/0266* (2013.01); *H03J 2200/10* (2013.01)

(58) Field of Classification Search
CPC .......... H03B 2201/0266; H03B 5/1253; H03B 2200/0048; H03B 2200/0062; H03B 2200/005; H03B 2201/011; H03B 2201/025; H03L 7/0991; H03L 7/099; H03J 2200/10; H03J 3/20; H03J 5/244; H03J 5/246
See application file for complete search history.

(56) References Cited

U.S. PATENT DOCUMENTS

| | | | |
|---|---|---|---|
| 7,800,450 | B2 | 9/2010 | Park et al. |
| 9,287,836 | B2 | 3/2016 | Soe |
| 9,337,847 | B2* | 5/2016 | Staszewski ........ H03H 11/0405 |
| 9,356,557 | B1 | 5/2016 | Gao et al. |
| 2007/0247237 | A1* | 10/2007 | Mohammadi ........ H03B 5/1228 331/36 C |
| 2010/0271086 | A1 | 10/2010 | Bao et al. |
| 2013/0194050 | A1 | 8/2013 | Lee |
| 2016/0099720 | A1 | 4/2016 | Bashir et al. |
| 2017/0366137 | A1* | 12/2017 | Shahmohammadi ........................ H03B 5/1228 |

OTHER PUBLICATIONS

International Search Report and Written Opinion for International Patent Application No. PCT/SE2016/050782, dated May 12, 2017, 10 pages.

Examination Report for European Patent Application No. 16760565.8, dated Nov. 27, 2019, 8 pages.

* cited by examiner

BIASING CIRCUIT FOR CAPACITOR SWITCH TRANSISTOR AND METHOD THEREFORE

This application is a 35 U.S.C. § 371 national phase filing of International Application No. PCT/SE2016/050782, filed Aug. 23, 2016, the disclosure of which is incorporated herein by reference in its entirety.

TECHNICAL FIELD

The embodiments described herein relate to a biasing circuit and method for biasing a switching transistor, and in particular to a biasing circuit and method for biasing a switching transistor with reduced noise.

BACKGROUND

A voltage controlled oscillator (VCO) is often based on an inductive/capacitive component, often referred to as an LC-tank, which is used to set the frequency of the VCO.

In VCOs based on LC-tanks, it is known to control the frequency digitally, for example using switching transistors, for example MOSFET switches, that are used to connect or disconnect one or more capacitor cells forming part of a capacitor array. In this way the effective capacitance value of the LC-tank can be controlled or varied in order to set the frequency of the VCO.

Differential capacitor switches are often used, for example where a MOSFET is AC coupled, and thus a DC bias is required. FIG. 1 shows an example of such a known circuit, whereby a resistor R is used to bias the MOSFET switch T0, the MOSFET switch T0 being coupled between first and second capacitors $C0_A$ and $C0_B$. The first and second capacitors $C0_A$ and $C0_B$ together form a capacitor cell C0 of a larger capacitor array that comprises one or more similar capacitor cells C0 to CN (the other capacitor cells of the array not shown for clarity). One or more of such capacitor cells C0 of the capacitor array can be selectively coupled in parallel to an inductor L. In this way the capacitance value of the LC-tank can be controlled or selected, which in turn can be used, for example, to control the frequency of a voltage controlled oscillator.

The use of a bias resistor R for providing a DC bias for the MOSFET switch T0 has the following disadvantages. One the one hand the resistance value of the bias resistor R has to be large enough so that it does not load the LC-tank. However a large value of R increases chip area. On the other hand a small value of R has the effect of reducing the quality factor Q, whereby Q relates to the ratio of the reactance of a capacitor to the resistance of the capacitor at a given frequency. However, the phase noise is proportional to $1/Q^2$, thus a low Q is undesirable, since it has the effect of increasing the phase noise. Also, for a fixed amplitude the power consumption is proportional to $1/Q$.

The bias resistor R should be much larger than the equivalent parallel resistance Rp of the LC-tank, and for a 5 bit binary sized capacitor switch (i.e. a capacitor array comprising 5 capacitor cells $C_0$ to $C_5$), the bias resistor R for the least significant bit should also be 16 times larger than the most significant bit, thus 5 resistors with the value of 16x, 8x, 4x, 2x, x, wherein each resistor in turn should be significantly larger than Rp. As a consequence, these biasing resistors tend to take up a very large chip area.

SUMMARY

It is an aim of the present invention to provide a biasing circuit and method which obviate or reduce at least one or more of the disadvantages mentioned above.

According to a first aspect there is provided a biasing circuit for biasing a switching transistor, wherein the switching transistor is used for switching a respective capacitor cell into/out of a capacitor array. The capacitor array comprises one or more such capacitor cells, and wherein the capacitor array is coupled in parallel with a primary inductor to form an inductive/capacitive tank. The biasing circuit comprises a secondary inductor which is inductively coupled to the primary inductor, the secondary inductor being configured to provide a bias signal for biasing the switching transistor.

According to another aspect there is provided a method of biasing a switching transistor used for switching a respective capacitor cell into/out of a capacitor array, wherein the capacitor array comprises one or more such capacitor cells. The capacitor array is coupled in parallel with a primary inductor to form an inductive/capacitive tank. The method comprises inductively coupling a secondary inductor to the primary inductor, and biasing the switching transistor using the secondary inductor.

BRIEF DESCRIPTION OF THE DRAWINGS

For a better understanding of examples of the present invention, and to show more clearly how the examples may be carried into effect, reference will now be made, by way of example only, to the following drawings in which:

FIG. 3e is an example illustrating the voltages generated by the embodiment of FIG. 3a;

FIG. 4d is an example illustrating the voltages generated by the embodiment of FIG. 4a;

DETAILED DESCRIPTION

The following sets forth specific details, such as particular embodiments for purposes of explanation and not limitation. But it will be appreciated by one skilled in the art that other embodiments may be employed apart from these specific details. In some instances, detailed descriptions of well known methods, nodes, interfaces, circuits, and devices are omitted so as not obscure the description with unnecessary detail.

In the examples described herein a biasing circuit and method will be described in relation to biasing switching transistors, and in particular Metal Oxide Semiconductor Field Effect Transistors, MOSFETs. It is noted, however, that the biasing circuit and method are applicable to other forms of transistors and switching devices, including for example bipolar transistors, Field Effect Transistors (FETs), Junction Field Effect Transistors (JFETs) or other power or semiconductor switching devices.

As will be explained in further detail below, the embodiments described herein provide a secondary inductor L2 that is inductively coupled to a primary inductor L1 of an LC-tank, such that a switching transistor T0 (for example the drain and source of a switching transistor T0 comprising a MOSFET) can then be DC biased from the secondary inductor L2, for example from the center tap of the secondary inductor L2, for switching a capacitor cell into-out of a capacitor array that forms part of the LC-tank. As will be explained in the embodiments below, the use of a secondary inductor L2 creates a high impedance DC bias that has reduced noise, since resistive components are not used in the biasing circuit.

Figure 1:
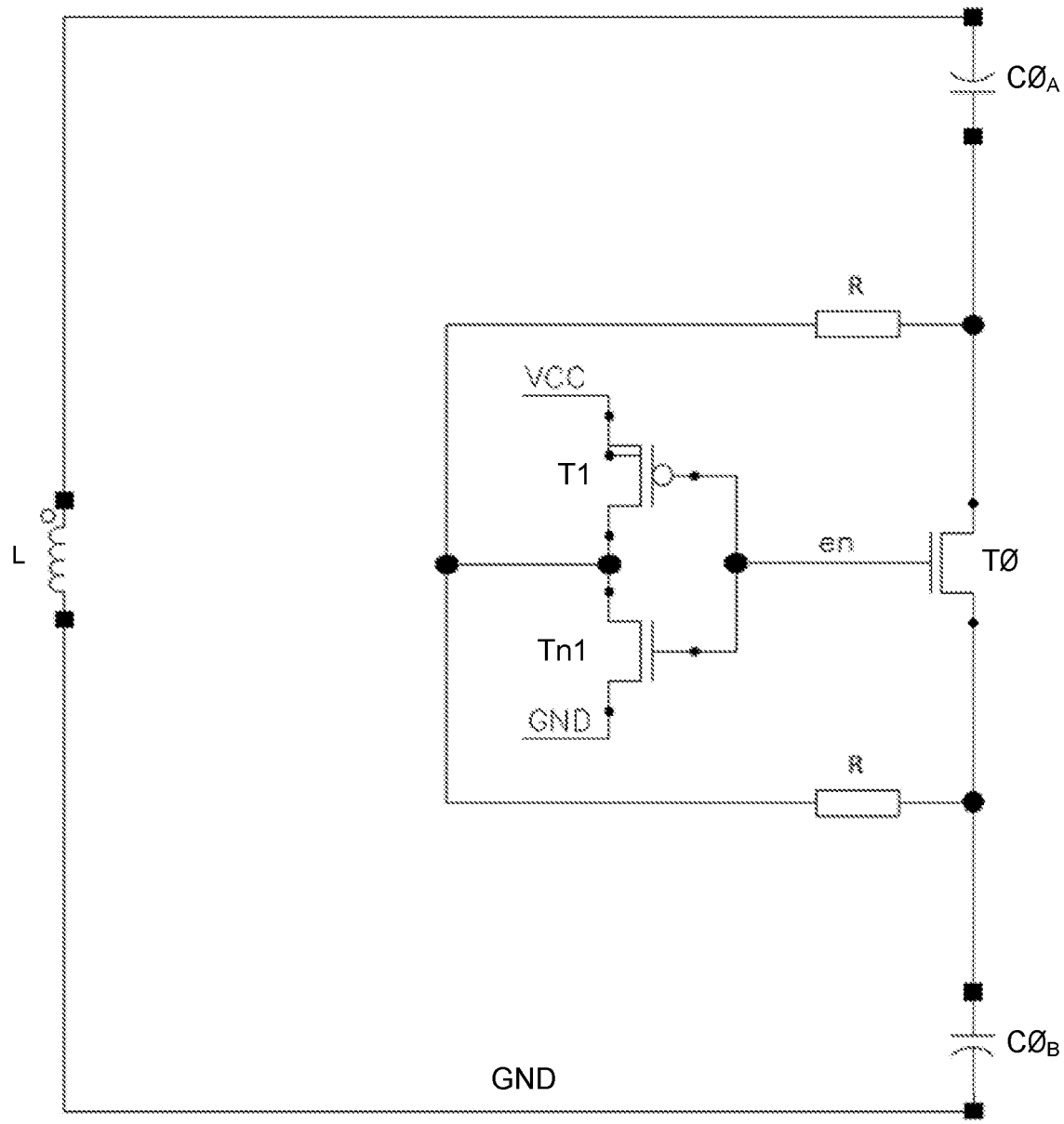
FIG. 1 shows an example of a known biasing circuit.
Figure 2:
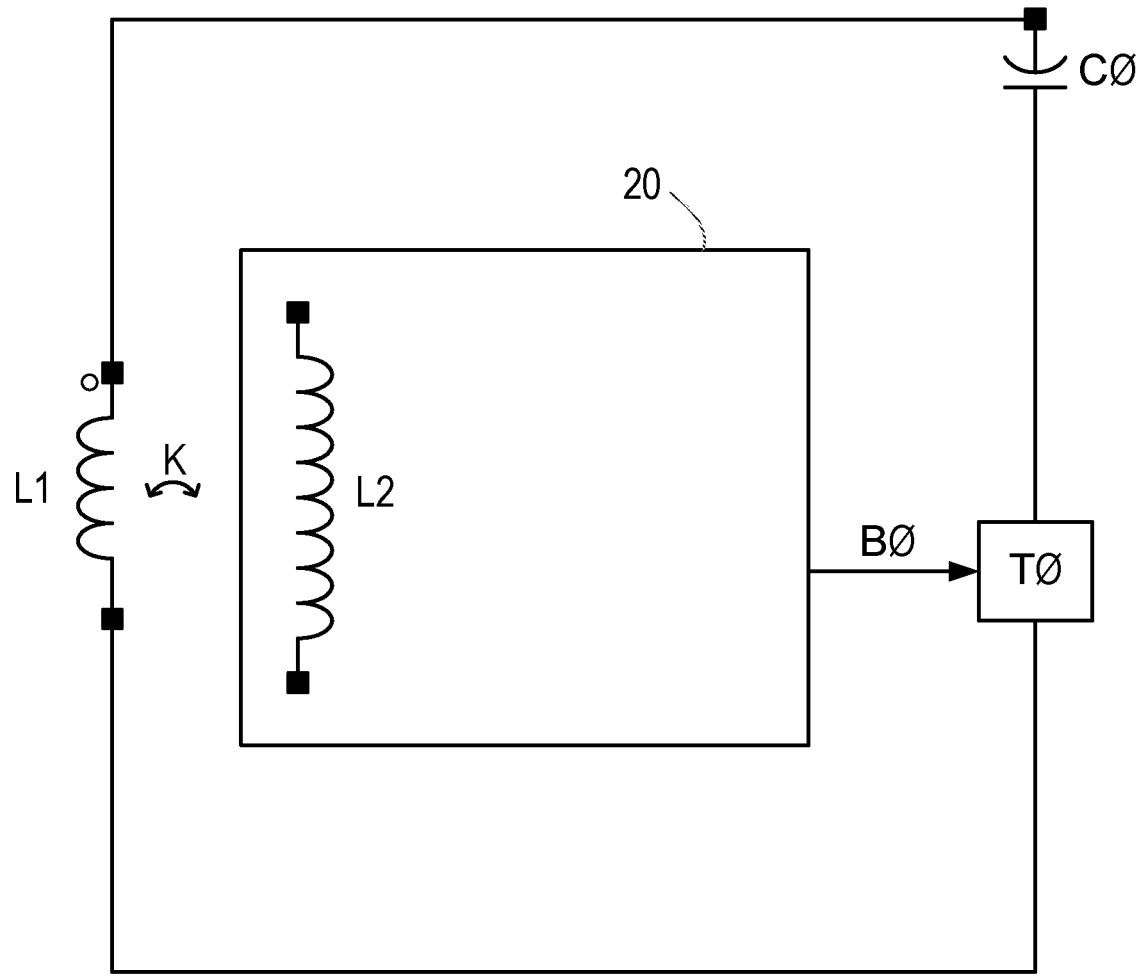
FIG. 2 shows an example of a biasing circuit according to an embodiment.

FIG. 2 shows an example of a biasing circuit 20 according to an embodiment, for biasing a switching transistor T0, wherein the switching transistor is used for switching a respective capacitor cell, C0, into/out of a capacitor array. The capacitor array comprises one or more such capacitor cells C0 to CN (with only one C0 being shown for clarity in FIG. 2), wherein the capacitor array is coupled in parallel with a primary inductor L1 to form an inductive/capacitive tank, LC-tank. The biasing circuit comprises a secondary inductor L2 which is inductively coupled to the primary inductor L1. The secondary inductor L2 is configured to provide a bias signal B0 for biasing the switching transistor T0.

Such an arrangement has the advantage that the coupling between the primary inductor L1 and the secondary inductor L2 is a wanted effect to provide a bias signal. Furthermore, even with an N bit (e.g. 5 bit) capacitor array, only one secondary inductor L2 is needed, for example, to provide a bias signal to all of the N stages corresponding to the N bits (as opposed to requiring a bias resistor R for each separate stage as required by the prior art technique).

As mentioned earlier, the switching transistor T0 may comprise a MOSFET, for example an N-channel MOSFET as shown in the examples.

Figure 3A:
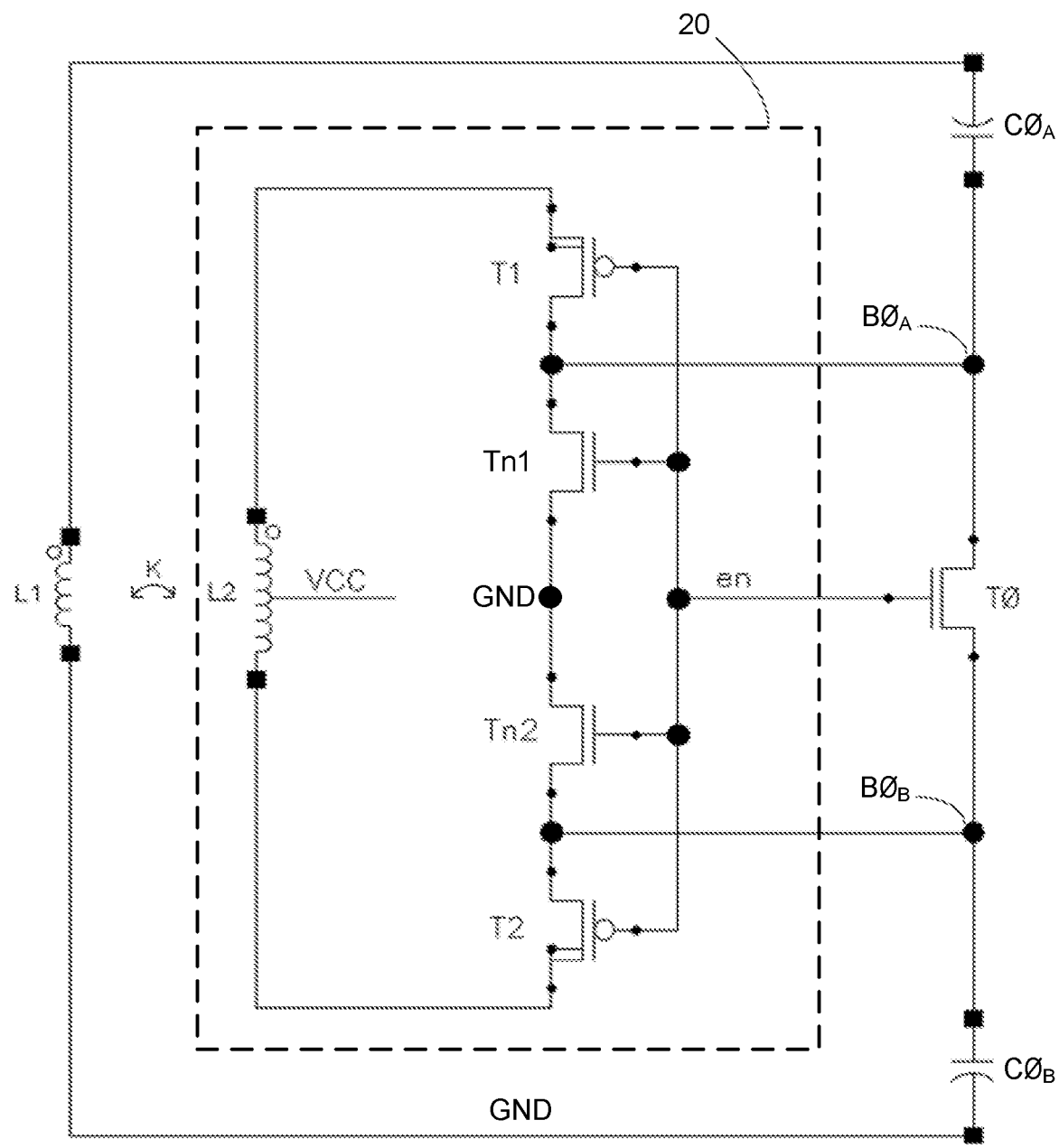
FIG. 3a shows an example of a biasing circuit according to an embodiment.

FIG. 3a shows a more detailed example of a biasing circuit 20 according to another embodiment, for use with an LC-tank comprising a primary inductor L1 coupled in parallel with a capacitor cell C0. In the example of FIG. 3a the capacitor cell C0 comprises a first capacitor $C0_A$ and a second capacitor $C0_B$ coupled in series, with a switching transistor T0 provided for differentially switching the capacitor cell C0 into/out of the circuit. One or more other capacitor cells, not shown, for example capacitor cells C0 to CN, together form a capacitor array. In this way one or more of such capacitor cells C0 to CN of the capacitor array can be selectively coupled in parallel to the primary inductor L1. The capacitance value of the LC-tank can therefore be controlled or selected, which in turn can be used, for example, to control the frequency of a voltage controlled oscillator.

In FIG. 3a a secondary inductor L2 is inductively coupled to the primary inductor L1, wherein the secondary inductor L2 is configured to provide a bias signal for biasing the switching transistor T0.

In the example of FIG. 3a, the drain node and source node of the switching transistor T0 are DC biased via transistors T1 and T2, or via Tn1 and Tn2, which control first and second bias signals $B0_A$ and $B0_B$. In the example of FIG. 3a the transistors T1 and T2 are P-channel transistors and the transistors Tn1 and Tn2 N-channel transistors. These transistors are used to bias the drain and source of the switching transistor T0 to either a high voltage or ground.

An enable signal, EN, is controlled, for example by a controller (not shown) which decides whether or not a particular capacitor cell of the capacitor array is to be connected to the LC-tank.

When the enable signal EN is high, transistors T1 and T2 are disabled, while transistors Tn1 and Tn2 are turned on, thus coupling the drain and source of switching transistor T0 to ground, GND. This connection is provided in the example of FIG. 3a to prevent the drain and source nodes from otherwise floating. During the period when enable signal EN is high, and hence the gate of Transistor T0 is also high, this controls the transistor T0 to turn on fully, and maximize the overdrive voltage to thereby minimize the on-resistance, Rds on, of the switching transistor T0.

When the enable signal EN is low, transistors Tn1 and Tn2 are disabled. Transistors T1 and T2 are turned on, such that the drain and source of the switching transistor T0 are now connected across first and second ends of the secondary inductor L2 (i.e. across the secondary inductor L2). The voltage across the secondary inductor L2 may be configured to be identical or substantially the same, for example in phase and amplitude, to the voltage across the drain-to-source of the switching transistor T0. An identical or substantially similar voltage may be achieved by selecting or configuring the coupling factor K between the primary inductor L1 and the secondary L2 so that the voltage over the secondary inductor L2 is substantially the same as the voltage created by the division of the capacitor cell C0 (i.e. $C0_A+C0_B$) to the off-capacitance CP of the switching transistor T0, as explained further below in FIGS. 3d and 3e. This provides a high impedance DC bias that in theory has little or no noise.

Thus, from the above it can be seen that in some examples the bias signal ($B0_A$, $B0_B$) is derived from the secondary inductor L2, for example a center tap of the secondary inductor L2.

A coupling factor K between the primary inductor L1 and the secondary inductor L2 may be selected such that the voltage over secondary inductor L2 is substantially the same as the voltage created by the division of the capacitance of the capacitor cell (C0) to the off-capacitance (CP) of the switching transistor (T0) in its disabled state.

In the biasing circuit of FIG. 3a, a capacitor cell C0 therefore comprises a first capacitor $C0_A$ and a second capacitor $C0_B$ coupled in series, and wherein the drain and source nodes of the switching transistor T0 are coupled between the first capacitor $C0_A$ and the second capacitor $C0_B$, to differentially switch the first capacitor $C0_A$ and the second capacitor $C0_A$ of the capacitor cell C0 into or out of the capacitor array.

In the example of FIG. 3a, the biasing signal, $B0_A$, $B0_B$, is coupled to bias the drain node and the source node of the switching transistor T0.

The embodiment of FIG. 3a thus comprises a first pair of transistors comprising a second transistor T1 and a third transistor Tn1 coupled in series between a first end of the secondary inductor L2 and a reference potential, for example GND. A connecting node between the second transistor T1 and third transistor Tn1 is coupled to bias a drain node of the switching transistor T0 (shown as bias signal B0$_A$).

A second pair of transistors comprises a fourth transistor T2 and a fifth transistor Tn2 coupled in series between a second end of the secondary inductor L2 and the reference potential, e.g. a ground potential, GND. A connecting node between the fourth transistor T2 and fifth transistor Tn2 is coupled to bias a source node of the switching transistor T0 (shown as bias signal B0$_B$).

The second transistor T1 and fourth transistor T2 are controlled to couple the drain node B0$_A$ and source node B0$_B$, respectively, to the first end and the second end of the secondary inductor L2 when the switching transistor T0 is disabled (i.e. when the enable signal EN is low).

The third transistor Tn1 and fifth transistor Tn2 are controlled to couple the drain node B0$_A$ and source node B0$_B$, respectively, to a ground potential GND when the switching transistor T0 is switched on (i.e. when the enable signal EN high).

In the example of FIG. 3A the second transistor T1, fourth transistor T2 are P-channel transistors, and the third transistor Tn1, fifth transistor Tn2 and switching transistor T0 are N-channel transistors. The gates of the switching transistor T0, second transistor T1, third transistor Tn1, fourth transistor T2 and fifth transistor Tn2 are biased by a common enable signal, EN. The combination of transistors therefore act to bias the drain and source of the switching transistor T0 to either a high voltage or ground, depending on the status of the enable signal EN.

Therefore, as mentioned above, when the enable signal EN is high the N-channel transistors Tn1, Tn2 are turned on, thus connecting the drain (B0$_A$) and source (B0$_B$) of the switching transistor T0 to GND, while the P-channel transistors T1, T2 are turned off. When the enable signal EN is low the N-channel transistors Tn1, Tn2 are turned off, while the P-channel transistors T1, T2 are turned on, thus T1 connects the drain node B0$_A$ to the first, e.g. positive side of the secondary inductor L2, and T2 connects the source node B0$_B$ to the second, e.g. negative side of the secondary inductor L2.

Figure 3B:
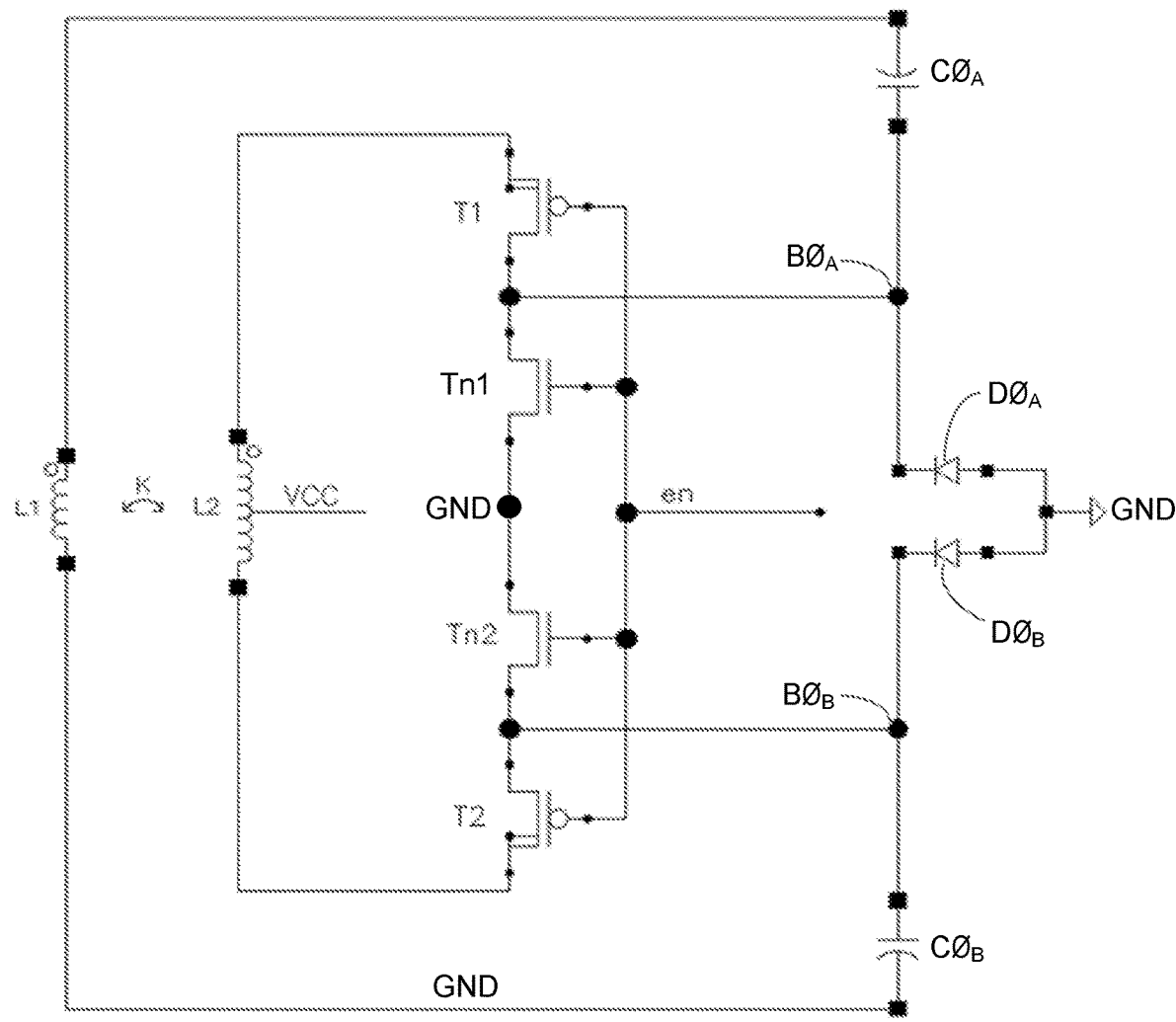
FIG. 3b shows an example of the biasing circuit according to the embodiment of FIG. 3a in a particular operating state.

FIG. 3b shows an example of the biasing circuit according to the embodiment of FIG. 3a in the "off-state", i.e. whereby the switching transistor T0 is in a disabled state, or turned off. In particular, FIG. 3b illustrates the drain junction diode D0$_A$ and source junction diode D0$_B$ of the drain and source, respectively, of the disabled switching transistor T0. The drain junction diode D0$_A$ and source junction diode D0$_B$ reflect the fact that the drain and source of an N-channel MOSFET has PN junction diodes to the substrate, because of the way they are built, and as such it is not desirable to forward bias these diodes. Since the PN junction diodes are connected to the substrate or ground (rather than differentially connected), a common mode sensitivity exists.

Improvements are gained by reverse biasing these diodes. These improvements include that:

The capacitance of these source/drain substrate diodes are voltage dependent and nonlinear, thus any amplitude noise will result in phase noise due to the amplitude to phase conversion of the voltage dependent capacitor "drain/source bulk diodes", thus the larger the reverse bias is the smaller the amplitude to phase conversion; and the effective capacitance of the switching transistor T0 in "off mode" CP can be reduced by reverse biasing these drain/source bulk diodes. Thus a larger switching transistor T0 can be used thereby reducing the on-resistance, Rds on, of the switching transistor T0.

Figure 3C:
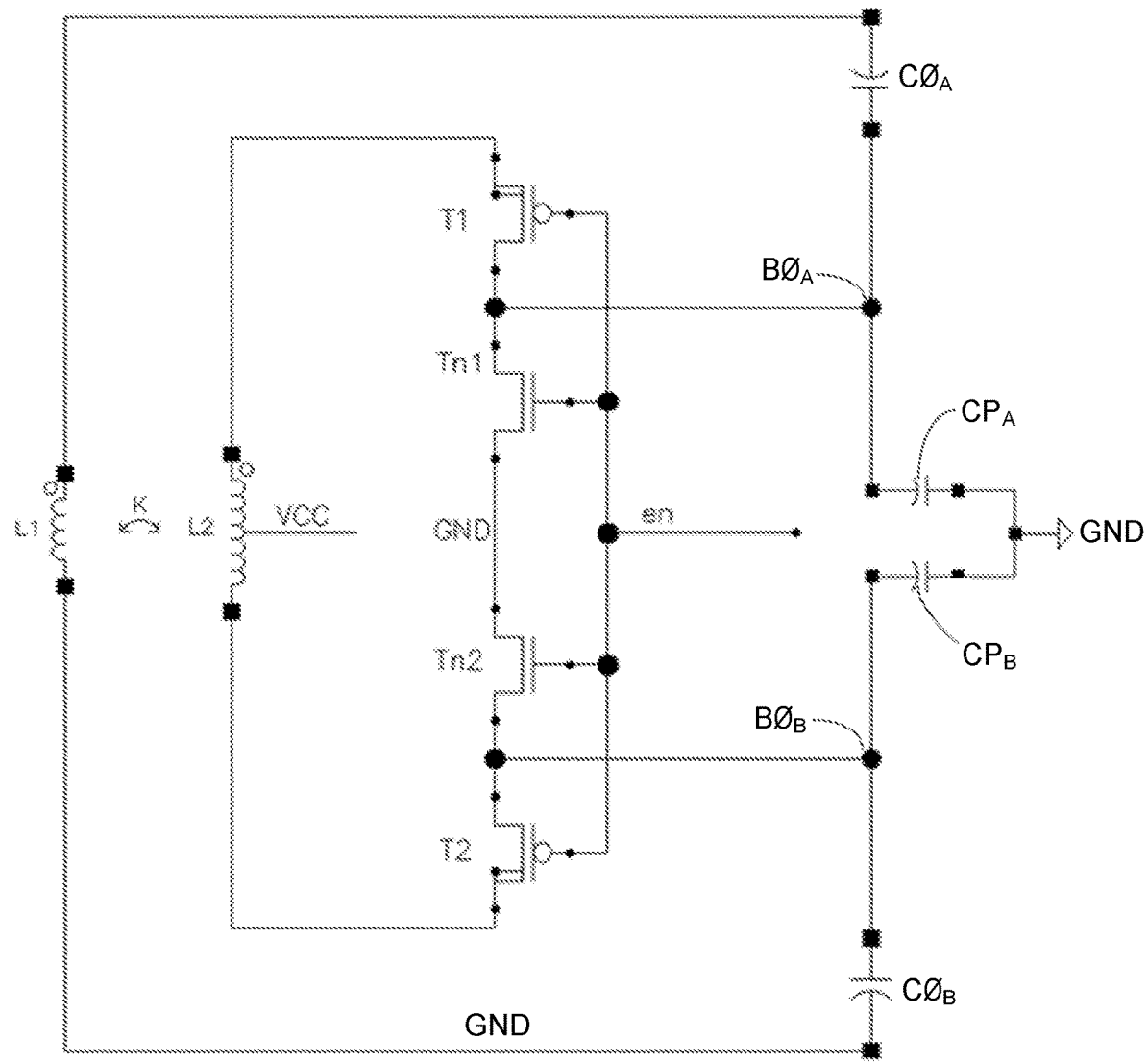
FIG. 3c shows an example of the biasing circuit according to the embodiment of FIG. 3a in a particular operating state.

FIG. 3c shows another simplified schematic of the embodiment of FIG. 3a in an "off-state", i.e. with the switching transistor T0 disabled. In this schematic the drain and source junction diodes D0$_A$ and D0$_B$ of FIG. 3b are replaced with off-capacitances CP$_A$ and CP$_B$.

Figure 3D:
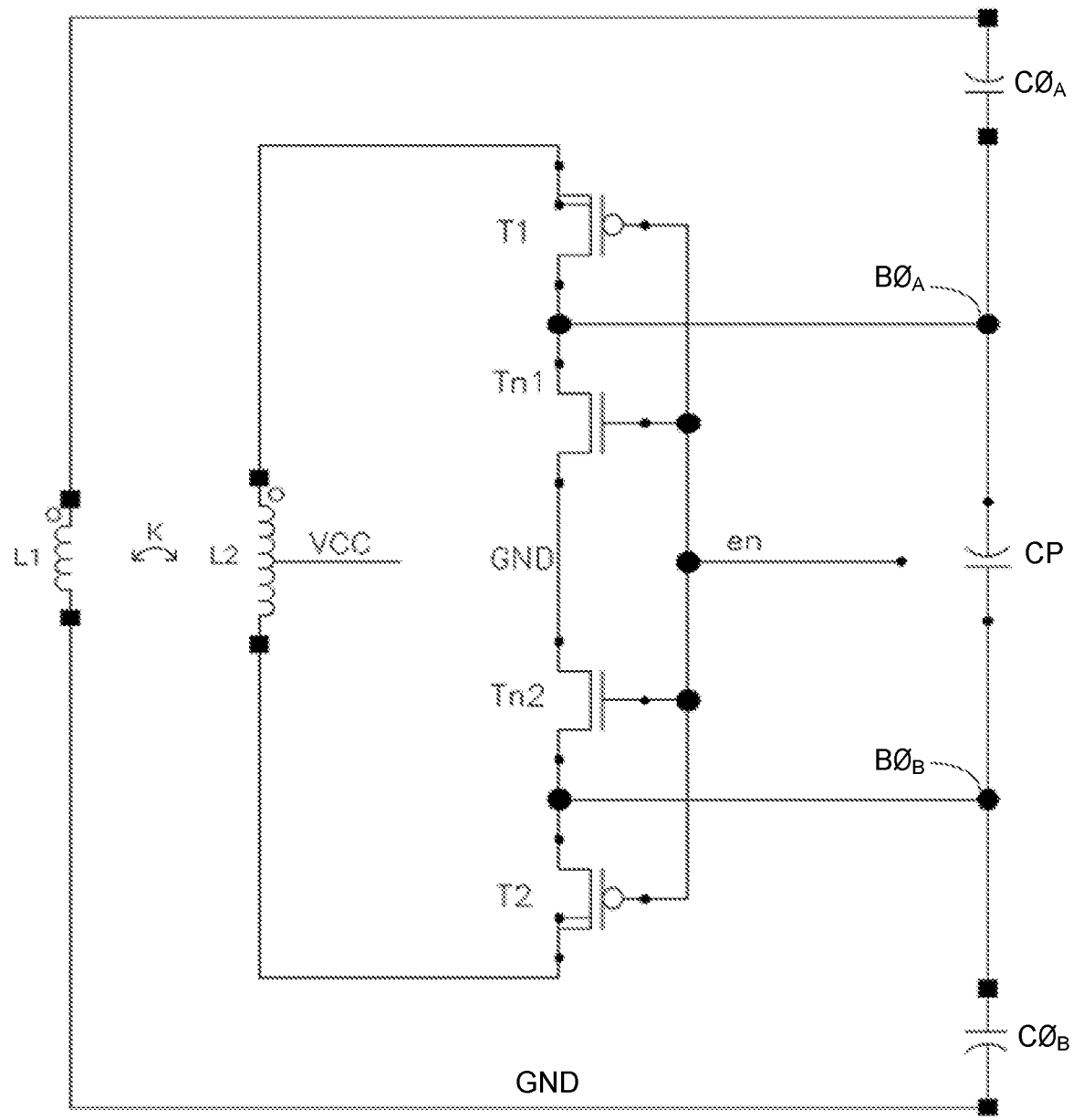
FIG. 3d shows an example of the biasing circuit according to the embodiment of FIG. 3a in a particular operating state.

FIG. 3d shows another simplified schematic of the embodiment of FIG. 3a in an "off-state", i.e. with the switching transistor T0 disabled. In this schematic the two single ended off-capacitances CP$_A$ and CP$_B$ of FIG. 3c are replaced with one differential off-capacitance CP.

In FIG. 3d, if there is a sinus voltage over inductor L1 (assuming a sinusoidal tank voltage), then the secondary inductor L2 will supply a sinus voltage to the drain and source of the switching transistor T0. The amplitude of this voltage depends on the coupling factor K between the primary inductor L1 and the secondary inductor L2, and in this case the coupling factor K can be designed so that the voltage generated by the secondary inductor L2 is identical in phase and amplitude to the unloaded voltage generated by the voltage division between C0$_A$, C0$_B$, CP.

Figure 3E:
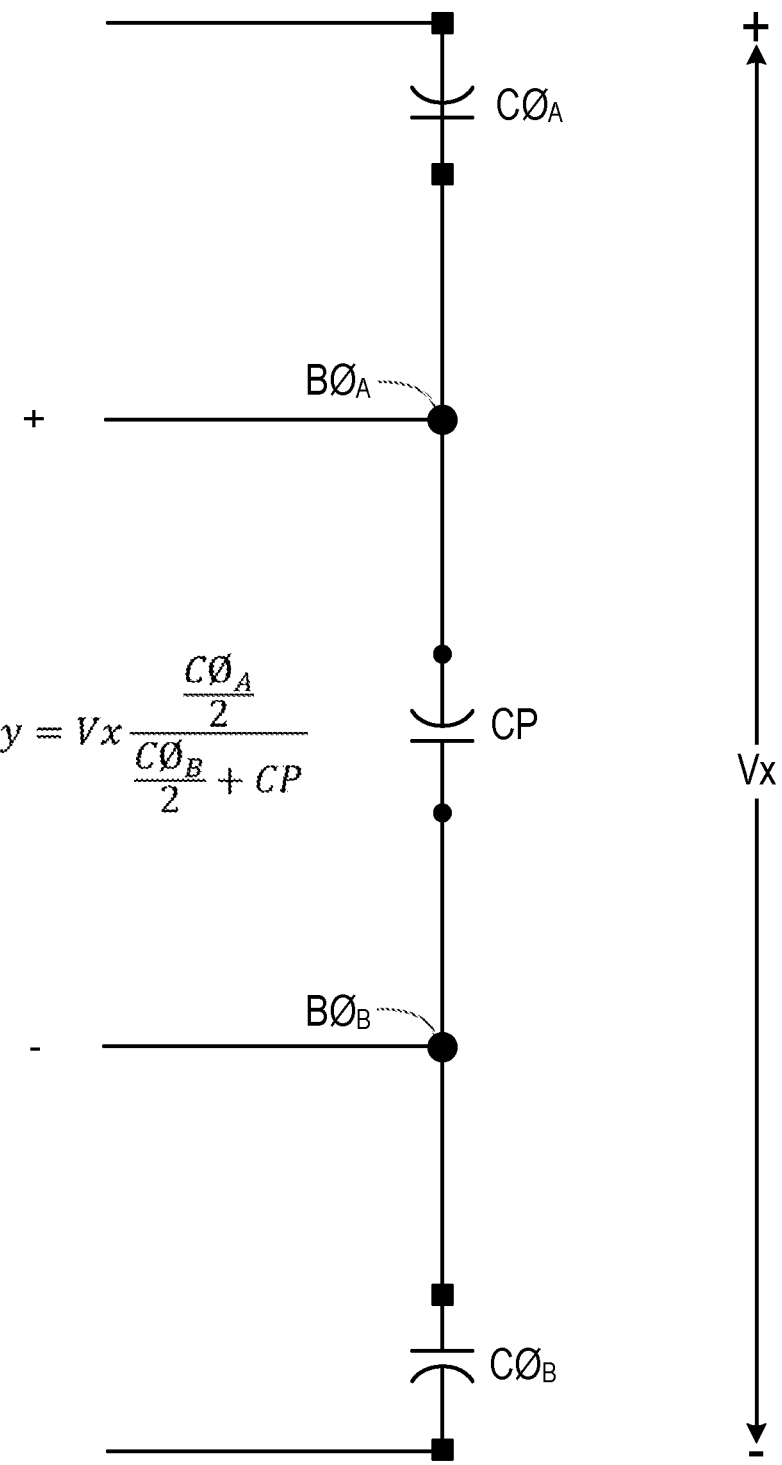

FIG. 3e shows the voltage VB0$_A$–VB0$_B$, illustrated as the voltage Vy, generated by the voltage division between C0$_A$, C0$_B$, CP. As can be seen:

$$Vy = Vx \frac{\frac{C\phi_A}{2}}{\frac{C\phi_B}{2} + CP}$$

While the embodiment of FIG. 3a has been shown with differential capacitor switching, it is noted that the biasing circuit of the present invention may also be used with single ended capacitor switching.

Furthermore, it is noted that the P-channel and N-channel transistors of FIG. 3a, and the other embodiments described herein, can be changed, for example swapped, if corresponding changes are made to the enable signal EN, for example inverting when the enable signal EN is controlled to be high and low, and/or to other reference potentials.

Figure 3F:
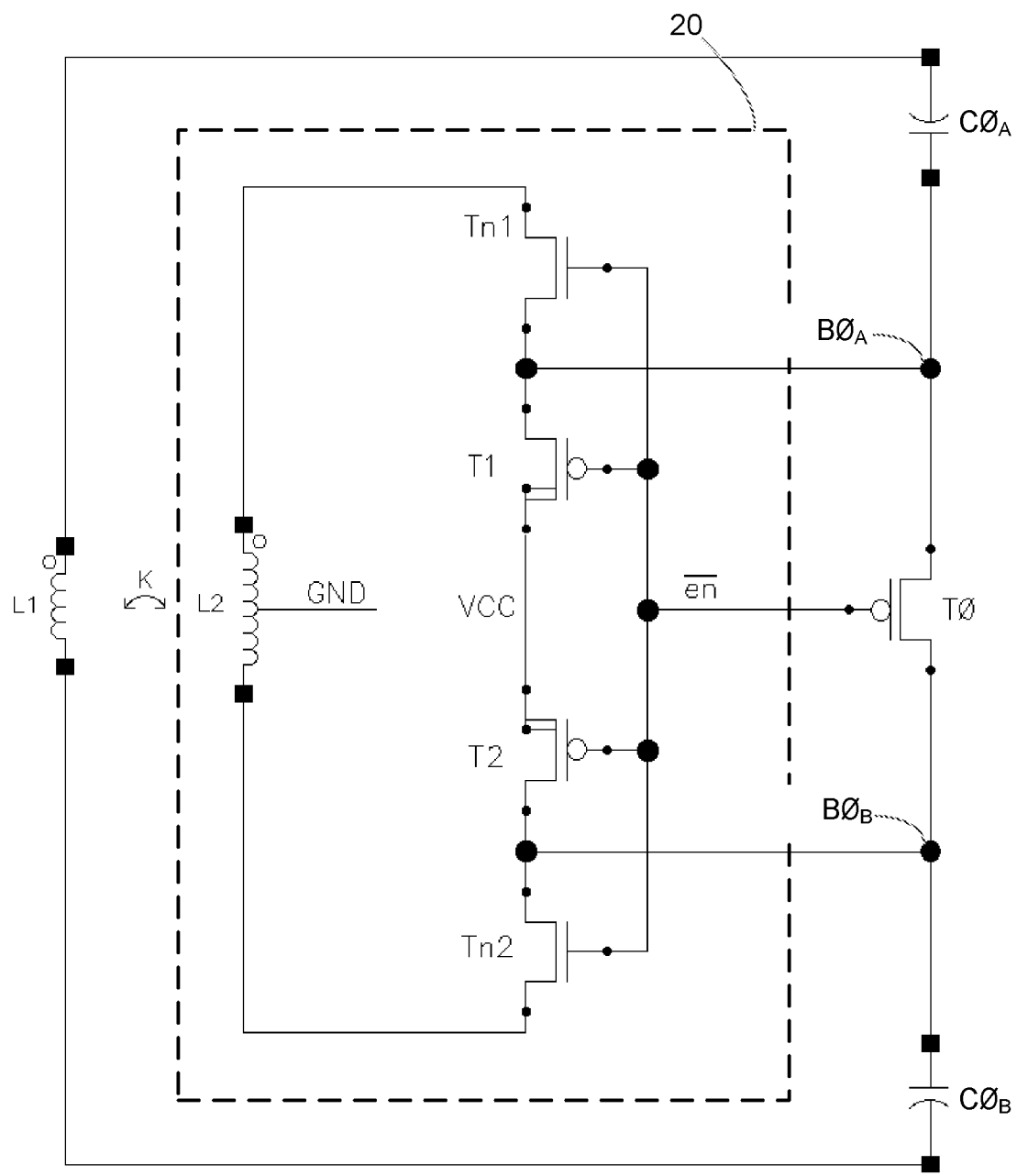
FIG. 3f shows an example of a biasing circuit according to an embodiment.

FIG. 3f shows an example where the main switching transistor T0 of FIG. 3a can be swapped from an N-channel to a P-channel, if transistor T1, Tn1 are swapped, T2 and Tn2 are swapped, also VCC for the center tap of the secondary inductor L2 is swapped to GND, while the source of Tn1 and Tn2 are connected to VCC instead of GND. Similar changes can be made to the other embodiments described herein.

Figure 4A:
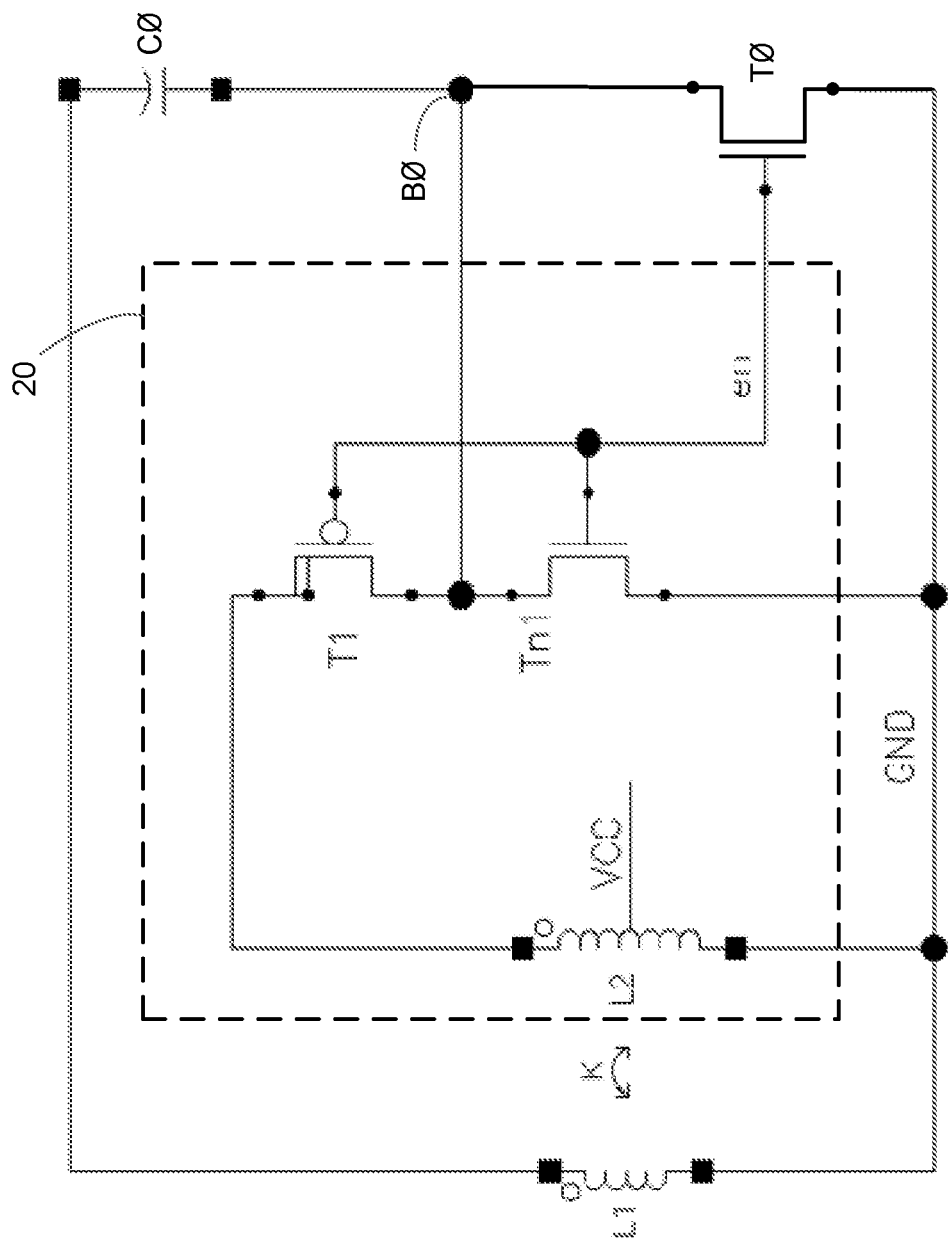
FIG. 4a shows an example of a biasing circuit according to an embodiment.

FIG. 4a shows an example of a biasing circuit 20 according to another embodiment, and in particular in an embodiment having single ended capacitor switching (rather than the differential capacitor switching of FIG. 3a).

In this embodiment the switching transistor T0 is used to connect the capacitor C0 to the LC tank. The capacitor C0 forms part of a capacitor cell, whereby one or more additional capacitor cells may be provided as part of a larger capacitor array for forming the capacitance of the LC-tank.

An enable signal, EN, is controlled, for example by a controller (not shown) which decides whether or not a particular capacitor cell of a capacitor array is to be connected to the LC-tank (e.g. for example in an application where the LC-tank is used as part of a VCO circuit for controlling the frequency of the VCO circuit).

When the enable signal EN is high, transistor T1 is disabled, while transistor Tn1 is turned on, thus coupling the drain of switching transistor T0 to ground, GND. This connection may be provided, otherwise the drain node would be floating. Since this is a single ended arrangement, the source of switching transistor T0 is permanently connected to ground in this example. During the period when enable signal EN is high, and hence the gate of Transistor T0 being high too, this controls the transistor T0 to turn on fully, and maximize the overdrive voltage to thereby minimize the on-resistance, Rds on. This causes the capacitor C0 to be connected across the primary inductor L1 of the LC tank.

When the enable signal EN is low, transistor Tn1 is disabled. The switching transistor T0 is also disabled in this state. Transistor T1 is turned on, such that the drain of the switching transistor T0 is now connected to a first side of the secondary inductor L2, with the source of the switching transistor T0 already connected to the second side of the secondary inductor L2 via the ground connection.

Figure 4B:
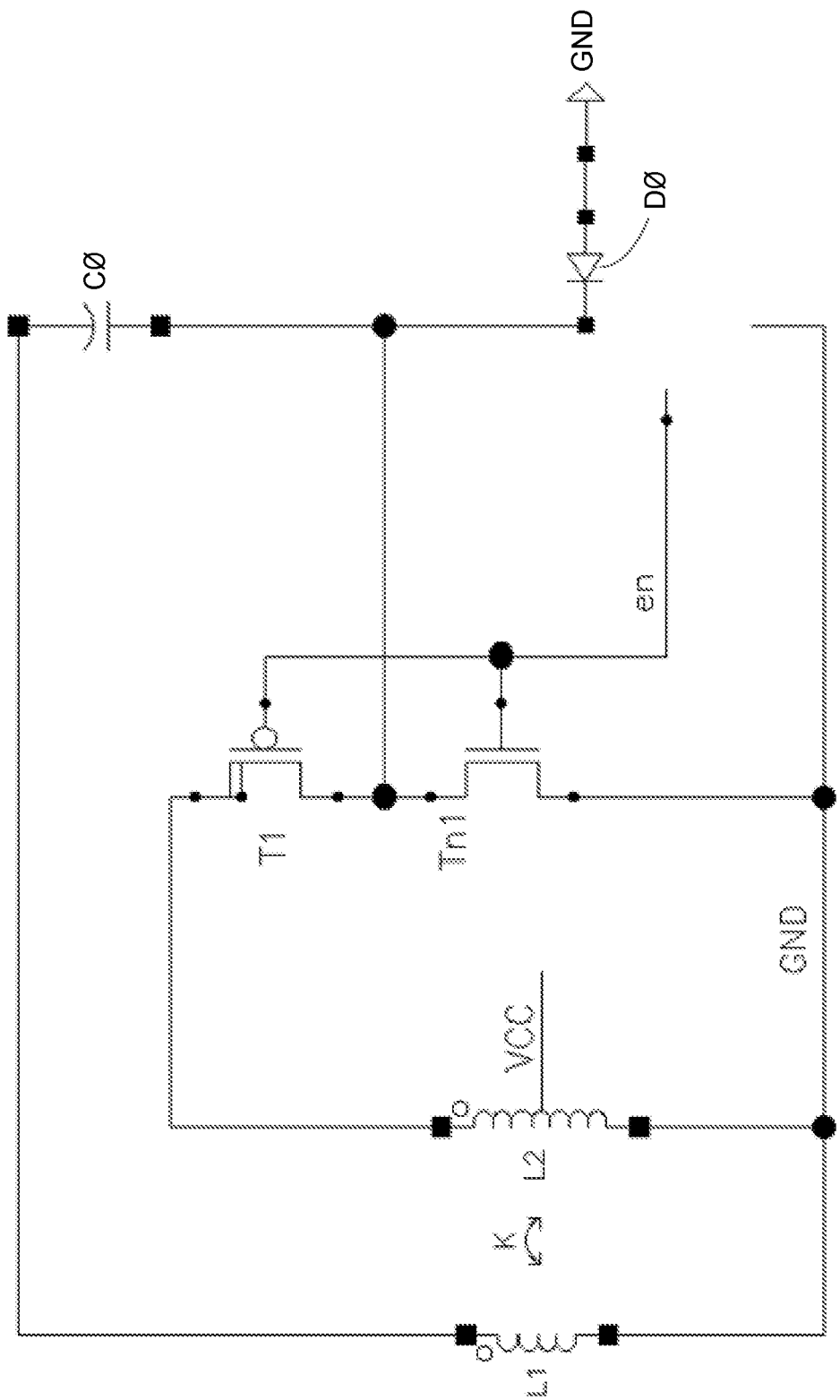
FIG. 4b shows an example of the biasing circuit according to the embodiment of FIG. 4a in a particular operating state.
Figure 4C:
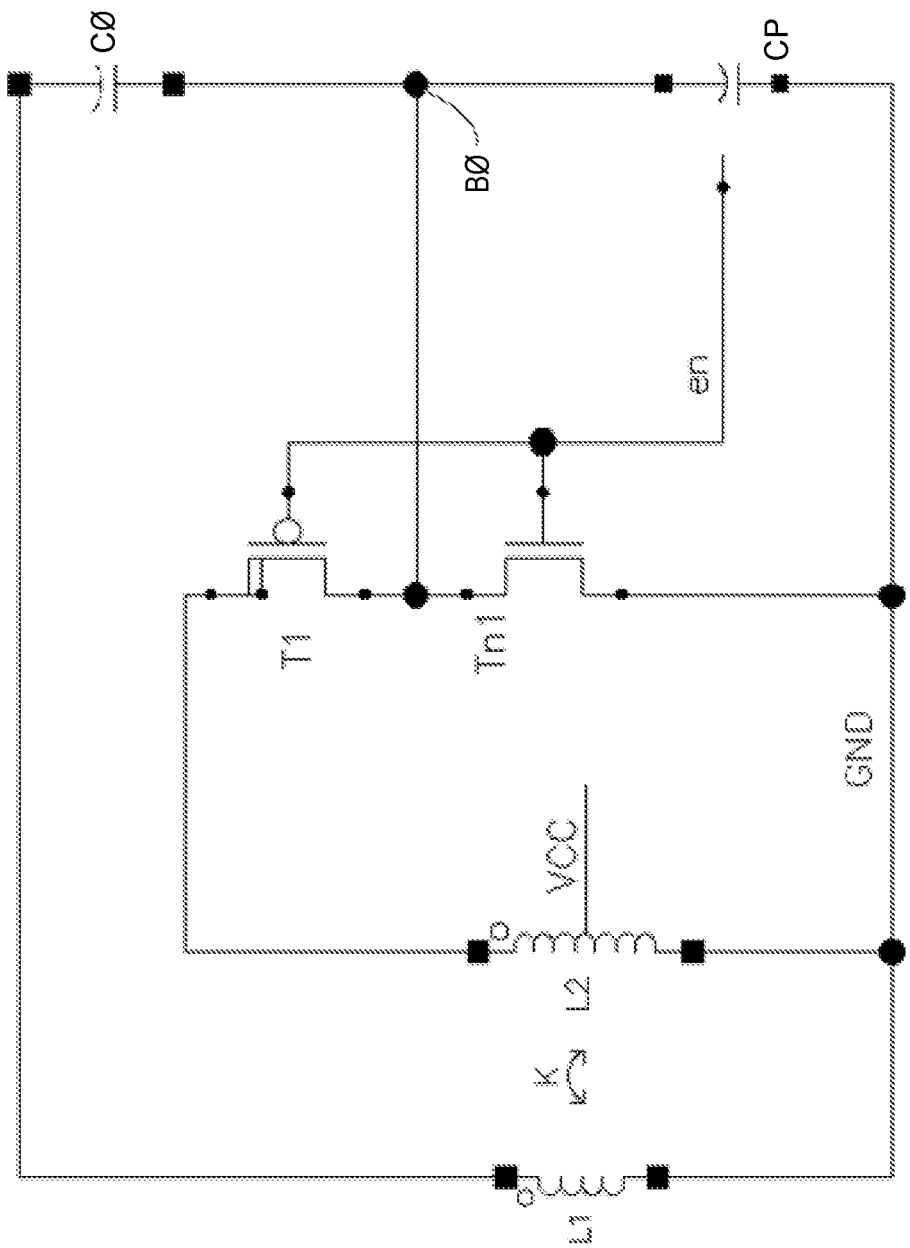
FIG. 4c shows an example of the biasing circuit according to the embodiment of FIG. 4a in a particular operating state.
Figure 4D:
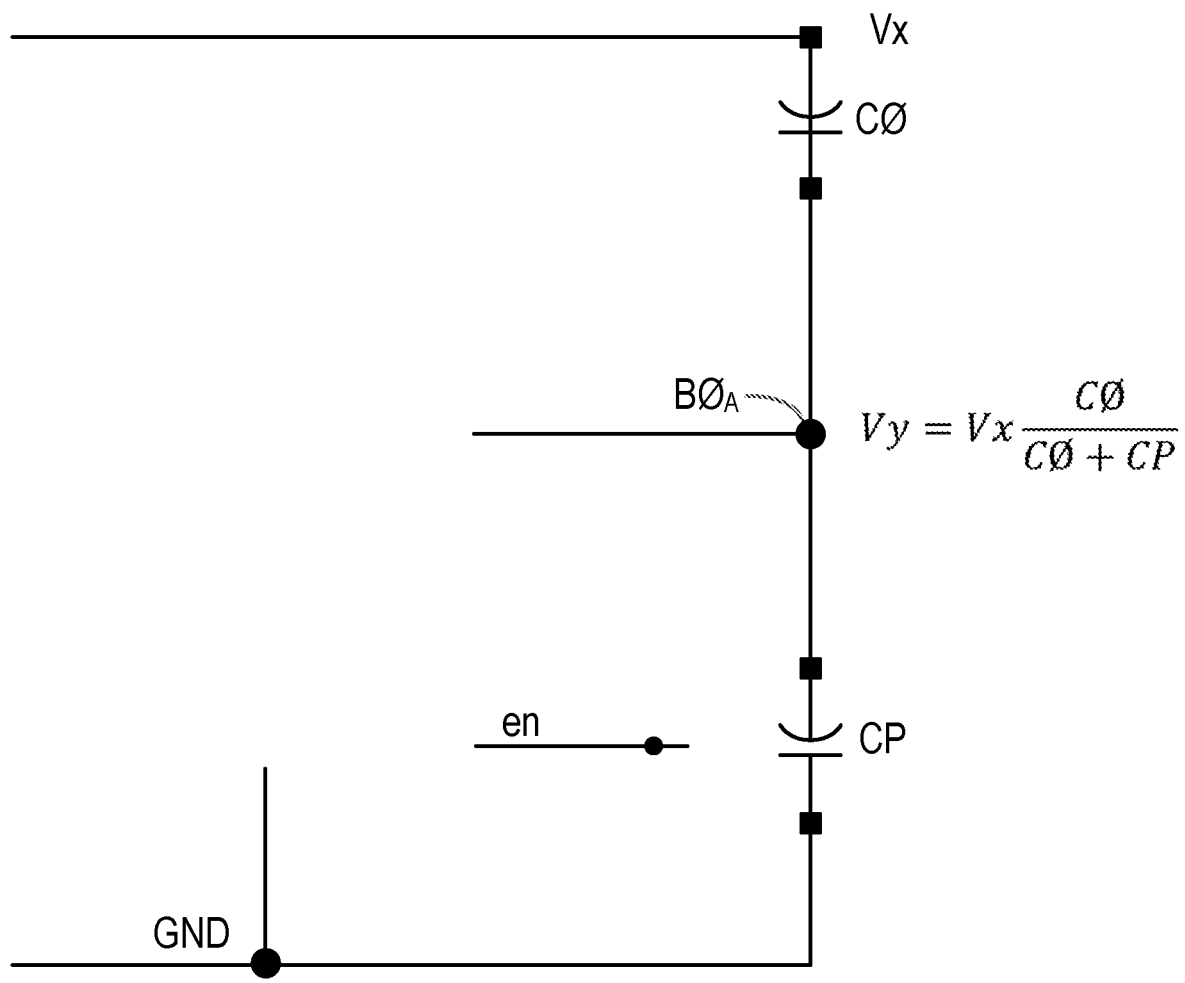

As above in FIG. 3a, the voltage across the secondary inductor L2 can be configured, by the coupling factor K, to be identical or substantially the same, for example in phase and amplitude, to the voltage across the drain-to-source of the switching transistor T0, generated by the voltage division from C0 and CP (as shown in FIGS. 4c and 4d). This provides a high impedance DC bias that in theory has little or no noise.

In the example of FIG. 4a, the biasing signal, B0, is coupled to bias the drain node of the switching transistor T0.

Thus, in the biasing circuit of FIG. 4a, a capacitor cell comprises a single capacitor C0, and wherein the switching transistor T0 is coupled to switch the single capacitor C0 of the capacitor cell into or out of the capacitor array from a single side.

In the biasing circuit of FIG. 4a, a first pair of transistors comprises a second transistor T1 and a third transistor Tn1 coupled in series between a first end of the secondary inductor L2 and a reference potential, e.g. GND. A connecting node between the second transistor T1 and third transistor Tn1 is coupled to bias a drain node of the switching transistor T0 (shown as bias signal B0). A second end of the secondary inductor L2 and a source node of the switching transistor T0 are coupled to the reference potential, GND.

FIG. 4b shows an example of the biasing circuit according to the embodiment of FIG. 4a in the "off-state", i.e. whereby the switching transistor T0 is in a disabled state. In particular, FIG. 4b illustrates the drain junction diode D0 of the disabled switching transistor T0.

FIG. 4c shows another simplified schematic of the embodiment of FIG. 4a in an "off-state", i.e. with the switching transistor T0 disabled. In this schematic the drain junction diode D0 of FIG. 4b is replaced with the equivalent off-capacitance CP.

FIG. 4d shows the voltage at node $B0_A$, illustrated as the voltage Vy, generated by the voltage division between C0 and CP. As can be seen:

$$Vy = Vx \frac{C\phi}{C\phi + CP}$$

Figure 5:
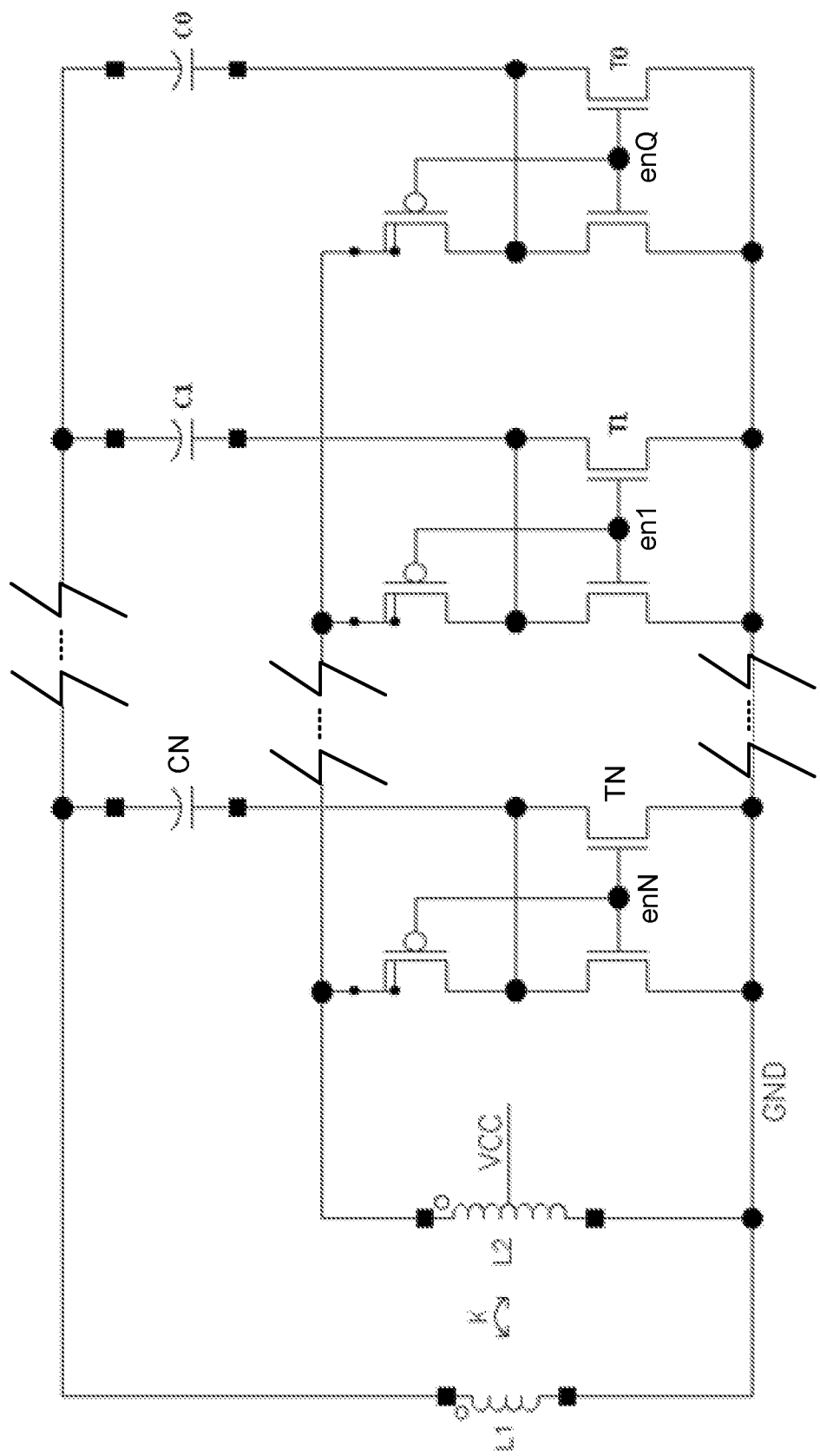
FIG. 5 shows an example of a biasing circuit according to an embodiment, illustrating an array of capacitor switches.

FIG. 5 shows an example of an array of capacitor switches (for example showing 3 bits in this example) with noiseless bias of the drain node. FIG. 5 shows an example for a single ended embodiment, for example similar to that shown in relation to FIGS. 4a to 4c. It is noted that an array of capacitor switches may also be provided for the type of embodiment described in FIGS. 3a to 3d.

It is noted that a capacitor array which forms part of the LC-tank may comprise any number of capacitor cells, i.e. any number of bits. Furthermore, a capacitor cell may comprise first and second differentially switched capacitors, or a single capacitor which is single ended switched, or additional capacitors (for example whereby two or more capacitors are used to provide a particular capacitance value of one of the capacitors shown in the embodiments described herein). It is also noted that a capacitor array may comprise a mixture of capacitor cells, for example one or more capacitor cells comprising differential switched capacitors in combination with one or more capacitor cells comprising a single capacitor which is single ended switched. Such a mixture may be required, for example, when there is a need to use mixed topologies in capacitor switches (due for example to limitations in minimum size capacitors, for example as required by a particular foundry), or maximum layout size due to cost of footprint. For example, if capacitor C0 is too small to implement, two larger capacitors could be connected in series. As another example, since a differential capacitor switch requires twice the area compared to a single-ended capacitor switch, it may be beneficial to use two series connected transistors for certain bits of a capacitor array, for example the capacitor of the most-significant-bit CMSB of a capacitor array.

Although the embodiments are shown having the various components coupled between a first potential, e.g. a positive voltage VCC, and a second potential, e.g. GND, it is noted that the circuit elements may be connected between different potentials, for example inverted compared to the examples, with the control and connection of the transistors adapted in the appropriate manner.

The embodiments described above provide a high impedance biasing, that is, where there is no or little current running in/out to a bias node B0. If there are two nodes with identical voltage, then even if they are connected together, no current will flow between them, since there is no voltage difference. Thus, according to the embodiments described herein, a DC bias can be created without loading the circuit while still using low resistance components for minimum noise.

In some examples an autotransformer or a secondary winding can be used to bias the drain of a MOSFET. In such examples the voltage from the autotransformer or secondary winding is configured such that the voltage is substantially equal to the voltage over the disabled MOSFET switch (Drain and source).

As described in FIGS. 3c and 4c, the disabled switching transistor, for example a MOSFET switch, has an off-capacitance CP between its drain and source. This off-capacitance creates a voltage division with the main capacitor C0 forming part of the capacitor cell. This voltage is configured to be substantially equal, for example identical, to the voltage generated by the autotransformer or secondary winding. This may be achieved by selecting or configuring the coupling factor K between the primary inductor L1 and the secondary inductor L2 so that the voltage over the secondary inductor L2 is substantially the same as the voltage created by the division of C0 to CP, where CP is the off-capacitance of transistor T0.

The embodiments described herein have an advantage of not having a tradeoff between low noise injection and loading effect. The embodiments enable the drain/source nodes of a switching transistor to be biased without loading the nodes of the LC-tank, and without injecting noise.

Furthermore, the embodiments described herein have an advantage in that the need for bulky resistor banks is removed, thus reducing chip area. Furthermore, there is little or no increase in chip area caused by the introduction of a secondary inductor L2, for example by adding the secondary inductor L2 inside the primary inductor L1, which does not consume any extra area.

Figure 6:
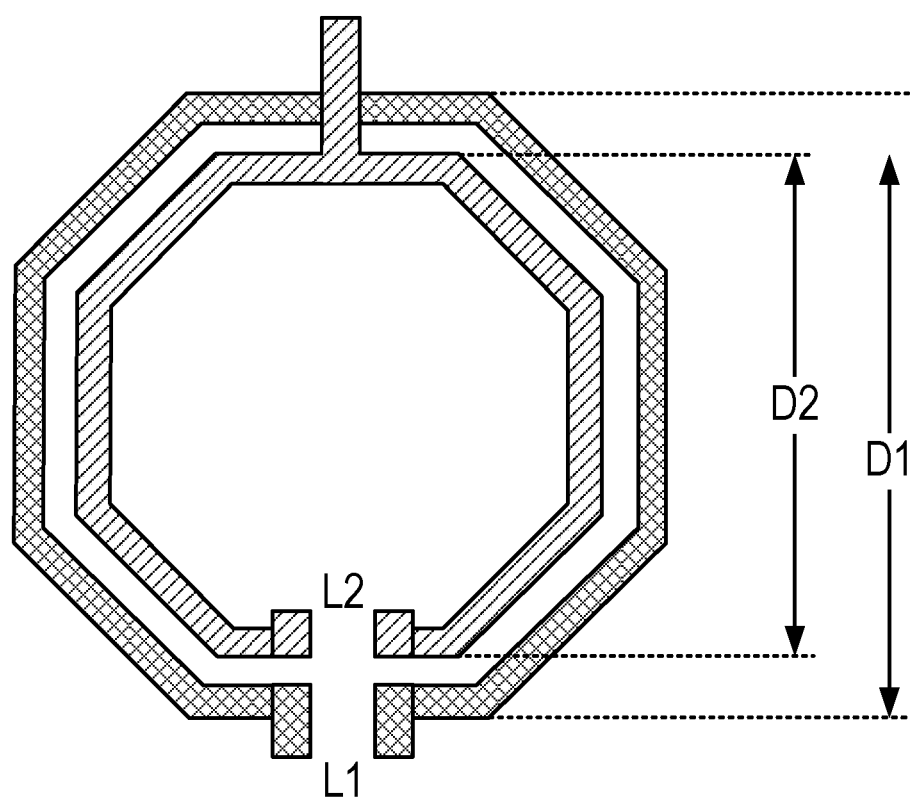
FIG. 6 shows an example of a primary inductor and a secondary inductor for use in an embodiment.

FIG. 6 shows an example of how a primary inductor L1 and a secondary inductor L2 may be configured according to an embodiment. The primary conductor L1 comprises a first winding and the secondary inductor L2 comprises a second winding, wherein the secondary winding is configured inside the primary winding. The first winding comprises a first diameter D1 and the secondary winding comprises a second diameter D2, wherein the second diameter D2 is smaller than first diameter D1.

Figure 7:
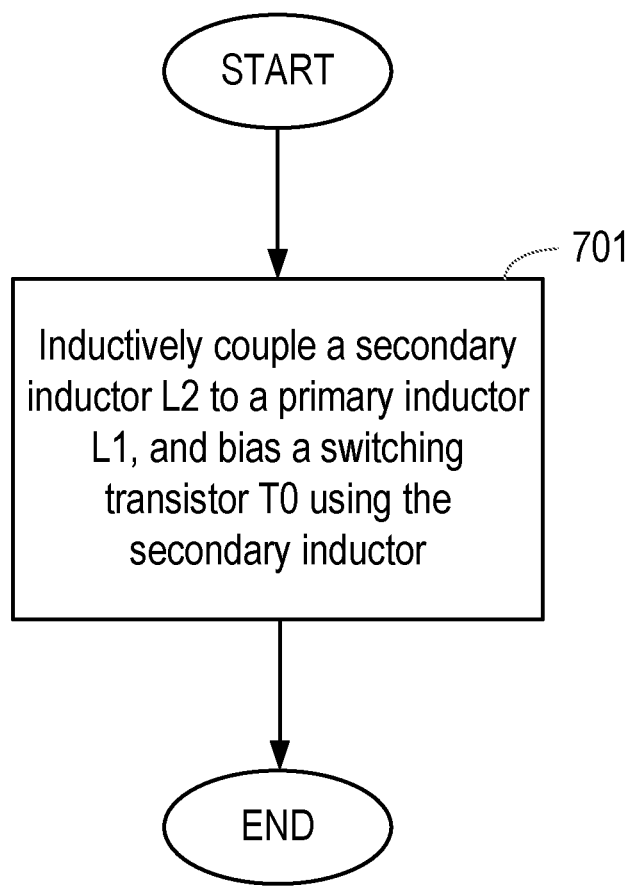
FIG. 7 shows an example of a method according to an embodiment.

FIG. 7 shows an example of a method according to another embodiment, of biasing a switching transistor T0, wherein the switching transistor is used for switching a respective capacitor cell C0 into/out of a capacitor array, wherein the capacitor array comprises one or more such capacitor cells C0 to CN, and wherein the capacitor array is coupled in parallel with a primary inductor L1 to form an inductive/capacitive tank, LC-tank. The method comprises inductively coupling a secondary inductor L2 to the primary inductor L1, and biasing the switching transistor T0 using the secondary inductor.

According to another aspect, there is provided an inductive/capacitive tank, LC-tank, comprising a primary inductor L1 and a capacitor array coupled in parallel to the primary inductor L1, the capacitor array comprising one or more capacitor cells C0 to CN. A switching transistor T0 is provided for switching a respective capacitor cell C0 into/ out of the capacitor array. A biasing circuit comprises a secondary inductor L2 which is inductively coupled to the primary inductor L1, the secondary inductor configured to provide a bias signal B0 for biasing the switching transistor T0. The biasing circuit may comprise a combination of transistors are described in the embodiments above. In a similar manner, the capacitor array may comprise a capacitor cell as described in the embodiments above.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

The invention claimed is:

1. A biasing circuit for biasing a switching transistor, wherein the switching transistor is used for switching a respective capacitor cell into/out of a capacitor array, wherein the capacitor array comprises one or more such capacitor cells, and wherein the capacitor array is coupled in parallel with a primary inductor to form an inductive/ capacitive tank, the biasing circuit comprising:
   a secondary inductor which is inductively coupled to the primary inductor, the secondary inductor configured to provide a bias signal for biasing the switching transistor.

2. The biasing circuit as claimed in claim 1, wherein the bias signal is derived from a center tap of the secondary inductor.

3. The biasing circuit as claimed in claim 1, wherein a coupling factor between the primary inductor and the secondary inductor is selected such that the voltage over secondary inductor is substantially the same as the voltage created by the division of the capacitance of the capacitor cell to the off-capacitance of the switching transistor in its disabled state.

4. The biasing circuit as claimed in claim 1, wherein a capacitor cell comprises a first capacitor and a second capacitor coupled in series, and wherein the drain and source nodes of the switching transistor are coupled between the first capacitor and the second capacitor, to differentially switch the first capacitor and the second capacitor of the capacitor cell into or out of the capacitor array.

5. The biasing circuit as claimed in claim 4, wherein the biasing signal is coupled to bias the drain node and/or the source node of the switching transistor.

6. The biasing circuit as claimed in claim 5, further comprising:
   a first pair of transistors comprising a second transistor and a third transistor coupled in series between a first end of the secondary inductor and a reference potential, and wherein a connecting node between the second transistor and third transistor is coupled to bias a drain node of the switching transistor; and
   a second pair of transistors comprising a fourth transistor and a fifth transistor coupled in series between a second end of the secondary inductor and the reference potential, and wherein a connecting node between the fourth transistor and fifth transistor is coupled to bias a source node of the switching transistor; and wherein
   the second transistor and fourth transistor are controlled to couple the drain node and source node of the switching transistor, respectively, to the first end and the second end of the secondary inductor when the switching transistor is disabled.

7. The biasing circuit as claimed in claim 6, wherein:
   the third transistor and fifth transistor are controlled to couple the drain node and source node of the switching transistor, respectively, to a ground potential when the switching transistor is switched on.

8. The biasing circuit as claimed in claim 6 wherein:
   the second transistor and fourth transistor are P-channel transistors; and
   the third transistor, fifth transistor and switching transistor are N-channel transistors.

9. The biasing circuit as claimed in claim 8, wherein the gates of the switching transistor, second transistor, third transistor, fourth transistor and fifth transistor are biased by a common enable signal.

10. The biasing circuit as claimed in claim 1, wherein a capacitor cell comprises a single capacitor, and wherein the switching transistor is coupled to switch the single capacitor of the capacitor cell into or out of the capacitor array from a single side.

11. The biasing circuit as claimed in claim 10, further comprising:
   a first pair of transistors comprising a second transistor and a third transistor coupled in series between a first end of the secondary inductor and a reference potential, wherein a connecting node between the second transistor and third transistor is coupled to bias a drain node of the switching transistor.

12. The biasing circuit as claimed in claim 11, wherein a second end of the secondary inductor and a source node of the switching transistor are coupled to the reference potential.

13. The biasing circuit as claimed in claim 6, wherein a first end of the secondary inductor comprises a positive side of the secondary inductor, and wherein a second end of the secondary inductor comprises a negative side of the secondary inductor.

14. The biasing circuit as claimed in claim 1, wherein the primary inductor comprises a first winding and the secondary inductor comprises a second winding, and wherein the secondary winding is configured inside the primary winding.

15. The biasing circuit as claimed in claim 14, wherein the first winding comprises a first diameter and the secondary winding comprises a second diameter, and wherein the second diameter is smaller than first diameter.

16. The biasing circuit as claimed in claim 14, wherein the voltage from the secondary winding is configured to be substantially the same as the voltage over the drain node and source node of the switching transistor when the switching transistor is disabled.

17. The biasing circuit as claimed in claim 1, wherein the primary inductor and the secondary inductor comprise an autotransformer.

18. The biasing circuit as claimed in claim 1, wherein the capacitor array and primary inductor forming the inductive/capacitive tank are coupled between a first potential and a reference potential.

19. The biasing circuit as claimed in claim 18, wherein the first potential is a positive voltage and the reference potential is a ground reference potential.

20. The biasing circuit as claimed in claim 1, wherein one or more of the switching transistor, the second transistor, the third transistor, the fourth transistor and the fifth transistor comprises a metal oxide field effect transistor, MOSFET.

21. A method of biasing a switching transistor used for switching a respective capacitor cell into/out of a capacitor array, wherein the capacitor array comprises one or more such capacitor cells, and wherein the capacitor array is coupled in parallel with a primary inductor to form an inductive/capacitive tank, the method comprising:
   inductively coupling a secondary inductor to the primary inductor, and biasing the switching transistor using the secondary inductor.

22. An inductive/capacitive tank comprising:
   a primary inductor;
   a capacitor array coupled in parallel to the primary inductor, the capacitor array comprising one or more capacitor cells;
   a switching transistor for switching a respective capacitor cell into/out of the capacitor array; and
   a biasing circuit comprising a secondary inductor which is inductively coupled to the primary inductor, the secondary inductor configured to provide a bias signal for biasing the switching transistor.

* * * * *